(12) United States Patent
Tai

(10) Patent No.: US 6,421,270 B1
(45) Date of Patent: Jul. 16, 2002

(54) MAGNETO-RESISTIVE RANDOM ACCESS MEMORY

(75) Inventor: Jy-Der David Tai, Phoenix, AZ (US)

(73) Assignee: AMIC Technology (Taiwan) Inc., Hsin-Chu Hsien (TW)

( * ) Notice: Subject to any disclaimer, the term of this patent is extended or adjusted under 35 U.S.C. 154(b) by 0 days.

(21) Appl. No.: 09/683,065

(22) Filed: Nov. 14, 2001

(30) Foreign Application Priority Data

Dec. 29, 2000 (TW) ......................................... 089128202

(51) Int. Cl.[7] .............................................. G11C 11/00
(52) U.S. Cl. ...................................................... 365/158
(58) Field of Search ............................. 365/158, 189.09, 365/210

(56) References Cited

U.S. PATENT DOCUMENTS 6,324,093 B1 * 11/2001 Perner et al. ................ 365/171

* cited by examiner

Primary Examiner—Richard Elms
Assistant Examiner—Van Thu Nguyen
(74) Attorney, Agent, or Firm—Winston Hsu

(57) ABSTRACT

A magneto-resistive random access memory (MRAM) includes a bias source, a first magneto-resistor and an address decoder. The bias source includes a current mirror for mirroring current, and a bandgap circuit connected to the current mirror for providing a fixed voltage across a second magneto-resistor. The first magneto-resistor has an array of magneto-resistors electrically connected to the bias source for storing bit information. The address decoder is electrically connected to the first magneto-resistor for selecting the array of magneto-resistors so as to access the bit information. The current mirror mirrors current onto the first magneto-resistor to generate a sensing current through the first magneto-resistor so that the voltage across the second magneto-resistor is proportional to a voltage across the first magneto-resistor.

11 Claims, 4 Drawing Sheets

MAGNETO-RESISTIVE RANDOM ACCESS MEMORY

BACKGROUND OF THE INVENTION

1. Field of the Invention

The present invention relates to a magneto-resistive random access memory (MRAM), and more specifically, to an MRAM with information stored therein can be accurately accessed.

2. Description of the Prior Art

Please refer to FIG. 1 of a schematic view of a magneto-resistive random access memory (MRAM) 10 according to the prior art. As shown in FIG. 1, the MRAM 10 comprises at least one memory cell array 12, a row decoder 13 and a column decoder 15. The memory cell array 12 comprises a bias source 18, magneto-resistors 19, 119, 219 and 319, word lines 16, 116, 216 and 316 connected to the row decoder 13, and a switch 17 connected to the column decoder 17. An overall resistance of the memory cell array 12 is equal toa sum of resistances of the magneto-resistors 19, 119, 219 and 319.

As the switch 17 is turned on by the column decoder 15, the bias source 18 provides a current with a fixed value to the magneto-resistors 19, 119, 219 and 319. An output voltage, representing bit information stored in selected magneto-resistor of the memory cell array 12, of the bias source 18 is then read as one of the word lines 16, 116, 216 and 316 is electrically connected to the row decoder 13. The bit information stored in each magneto-resistor of the memory cell array 12 is determined by a magnetized direction of respective magneto-resistor.

Please refer to FIG. 2 of the schematic view of another MRAM 20 according to the prior art. As shown in FIG. 2, the MRAM 20 comprises a bias source 21 having a current mirror 22, two PMOS transistors 24 and 124, a magneto-resistor 26 and a switch 83. The bit information stored in the MRAM 20 is determined by a magnetized direction of the magneto-resistor 26. The current mirror 22, comprising PMOS transistors 27, 127, 227 and 327, and NMOS transistors 29, 129, 229 and 329, is a device providing currents to the PMOS transistors 24 and 124 with a same value or a value with a fixed proportion. The magneto-resistor 26 is electrically connected to both an address decoder 81 and a switch 83. A startup circuit 28 is employed to initiate the current mirror 22 of the bias source 21.

A fixed voltage 23 is applied to both the current mirror 22 and the PMOS transistor 24. If width/length ratios (W/L ratios) of the PMOS transistors 27, 127, 24 are the same, a sensing current 25 which passes through the magneto-resistor 26 is the same as currents passing through the PMOS transistors 27, 127. The W/L ratios of the PMOS transistors 27, 127, 24 determine the currents flowing through the PMOS transistors 27, 127, 24. If the W/L ratios of the PMOS transistors 27, 127, 24 have a ratio of 1:m:n, then a ratio of the currents flowing through the PMOS transistors 27, 127, 24 is 1:m:n. Therefore, the currents passing through the PMOS transistors 27, 127, 24 can be adjusted by changing their W/L ratios.

The current mirror 22 and the PMOS transistor 24 are both operated in a saturation region to ensure a constant sensing current 25. When the switch 83 is turned on and the magneto-resistor 26 is selected by the address decoder 81, the constant sensing current 25 will flow through the magneto-resistor 26. Then the information stored in the magneto-resistor 26 can be detected by measuringa product of the sensing current 25 and the resistance of the magneto-resistor 26.

However, the magneto-resistor 26 may not be formed with an accurate resistance. If the resistance has a value beyond an acceptable range, the product of the sensing current 25 and the resistance of the magneto-resistor 26 will reach an unacceptable value. This will cause the PMOS transistors 24 and 124 to operate in a triode region, and the sensing current 25 will become unstable. Consequently, a signal to noise ratio (SNR) of the device is decreased, the accuracy of information detection is seriously damaged, and the performance of the MRAM is reduced.

SUMMARY OF THE INVENTION

It is therefore a primary object of the claimed invention to provide a magneto-resistive random access memory (MRAM) with an adjustable sensing current to solve the above mentioned problems.

According to the claimed invention, the magneto-resistive random access memory (MRAM) includes a bias source, a first magneto-resistor and an address decoder. The bias source includes a current mirror for mirroring current, and a bandgap circuit connected to the current mirror for providing a fixed voltage across a second magneto-resistor. The first magneto-resistor has an array of magneto-resistors electrically connected to the bias source for storing bit information. The address decoder is electrically connected to the first magneto-resistor for selecting the array of magneto-resistors so as to access the bit information. The current mirror mirrors current onto the first magneto-resistor to generate a sensing current through the first magneto-resistor so that the voltage across the second magneto-resistor is proportional to a voltage across the first magneto-resistor.

It is an advantage of the claimed invention that the voltage across the second magneto-resistor is proportional to the voltage across the first magneto-resistor. Therefore, the information stored in the first magneto-resistor can be accurately accessed.

These and other objectives of the present invention will no doubt become obvious to those of ordinary skill in the art after reading the following detailed description of the preferred embodiment, which is illustrated in the multiple figures and drawings.

DETAILED DESCRIPTION

Figure 1:
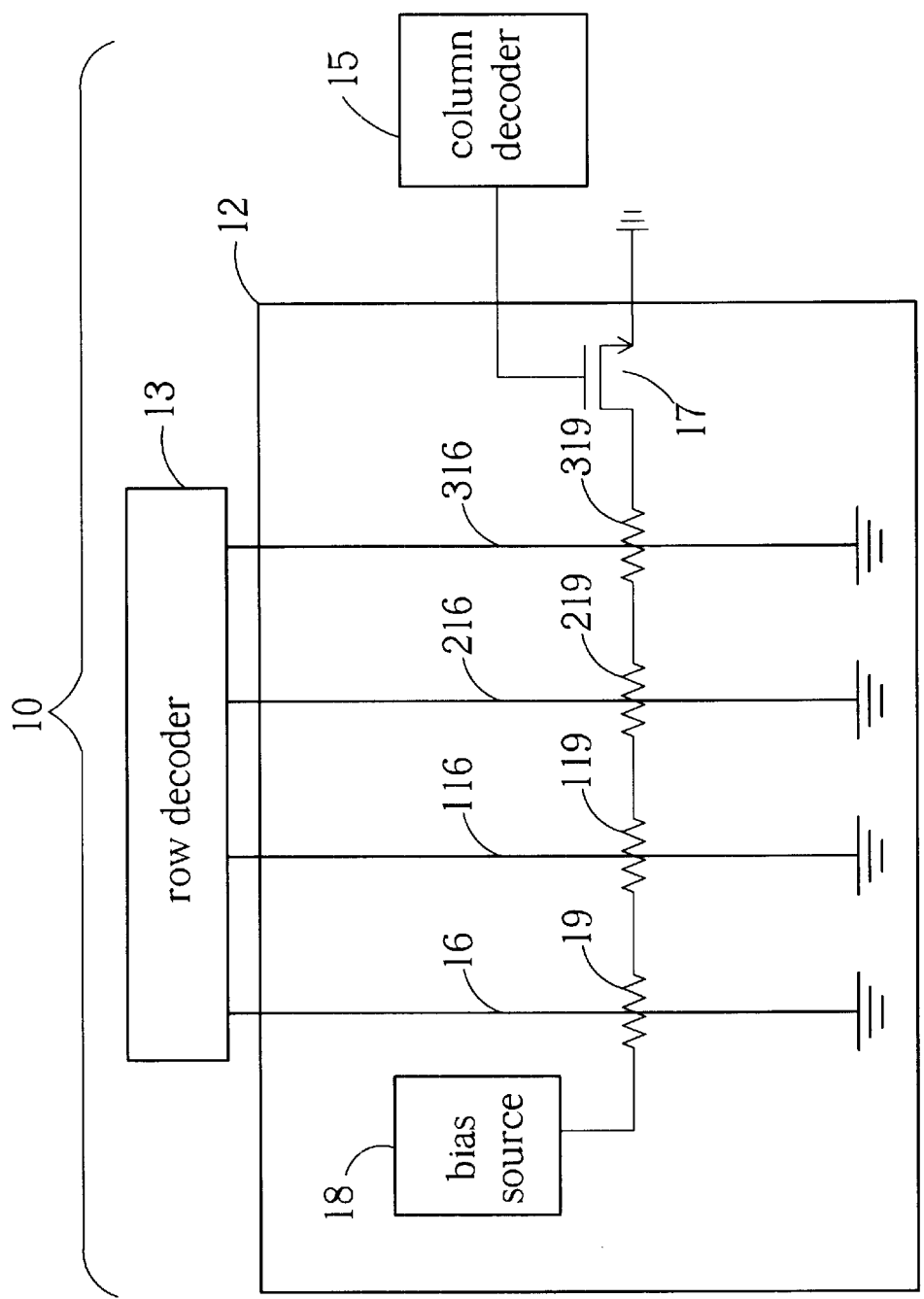
FIG. 1 is a schematic view of a magneto-resistive random access memory (MRAM) according to the prior art.
Figure 2:
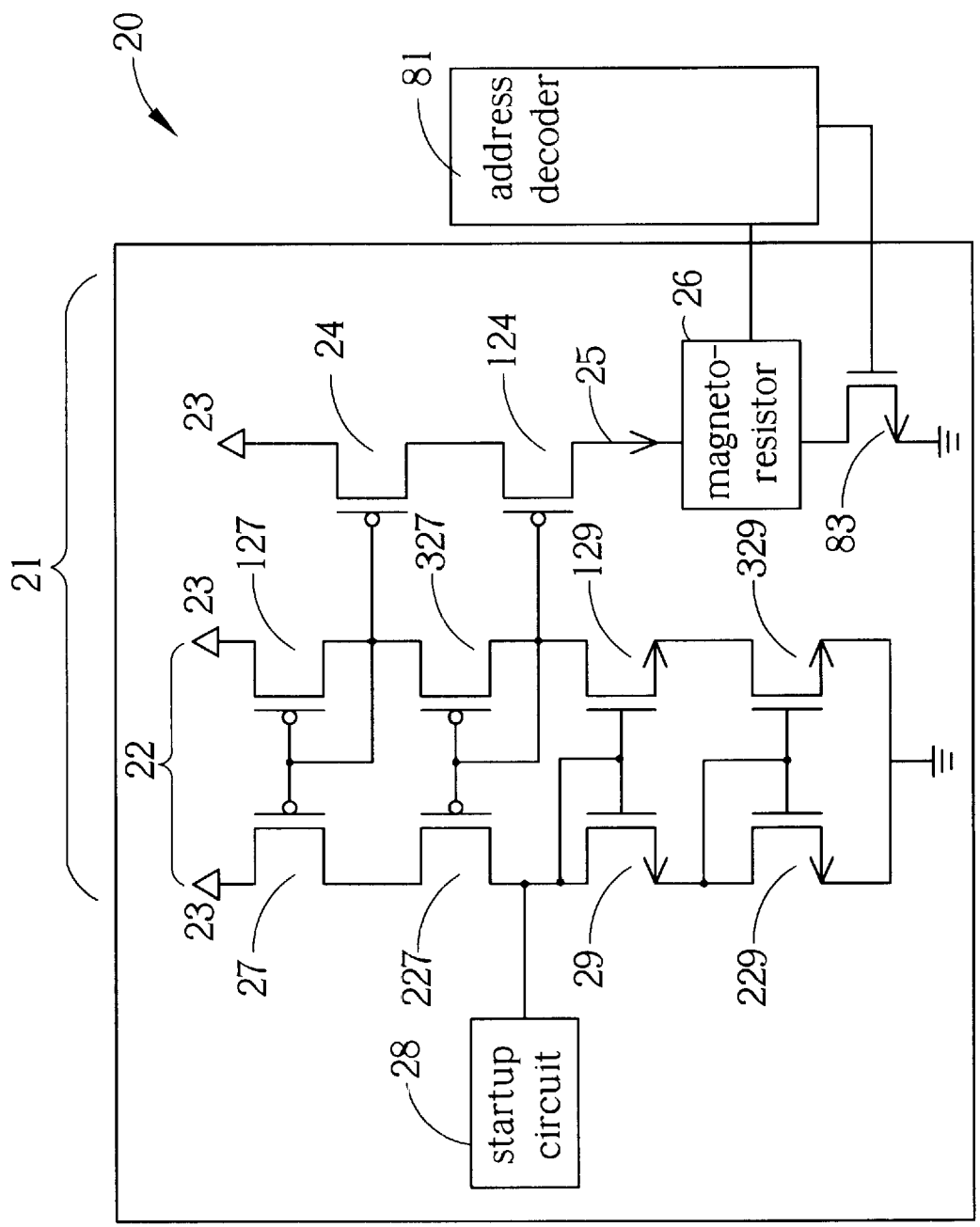
FIG. 2 is the schematic view of another prior art MRAM.
Figure 3:
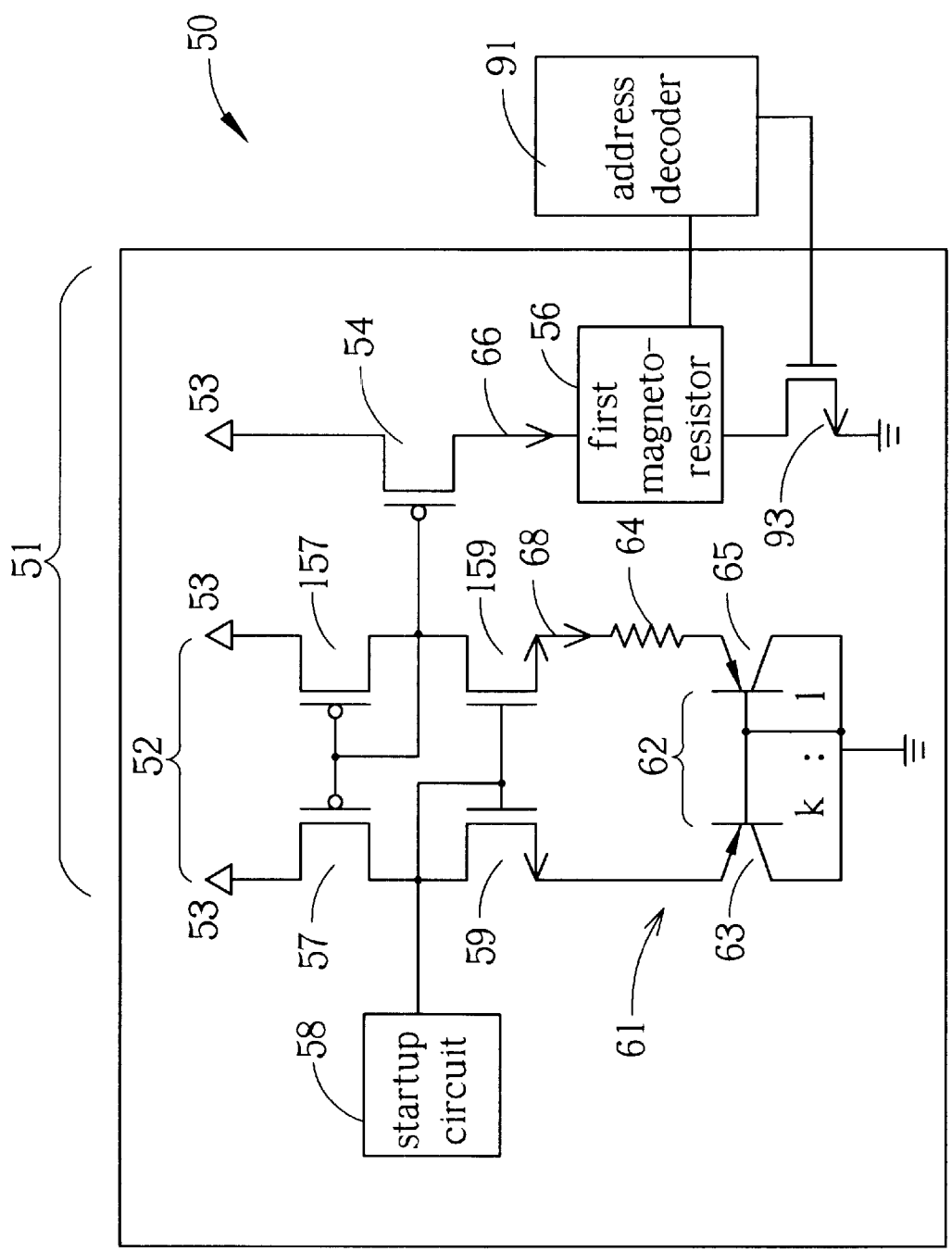
FIG. 3 is the schematic diagram of an MRAM according to the present invention.

Please refer to FIG. 3 of a schematic diagram of a magneto-resistive random access memory (MRAM) 50 according to the present invention. As shown in FIG. 3, the MRAM 50 comprises a first magneto-resistor 56 having a plurality of magneto-resistors formed in series, an address decoder 91 and a transistor switch 93. A resistance of the first magneto-resistor 56 equals to a sum of resistances of the magneto-resistors. Each of the magneto-resistors is used to store an information bit. And the information bit is determined by detecting a magnetized direction of the magneto-resistor. The bias source 51 comprises a current mirror 52, a PMOS transistor 54, and a bandgap circuit 61. The bandgap circuit 61 comprises a bipolar junction transistor pair (BJT pair) 62 and a second magneto-resistor 64. The current mirror 52 comprises PMOS transistors 57 and 157 as well as NMOS transistors 59 and 159. The address decoder 91 and the transistor switch 93 are both electrically connected to the first magneto-resistor 56. The BJT pair 62 comprises a first PNP BJT 63 and a second PNP BJT 65. The MRAM 50 further comprises a startup circuit 58 to turn on the current mirror 52 of the bias source 51.

The PMOS transistor 54 and the transistor switch 93, controlled by the address decoder 91, are both connected to the first magneto-resistor 56. The second PNP BJT 65 and the NMOS transistor 159 of the current mirror 52 are both electrically connected to the second magneto-resistor 64. The NMOS transistor 59 of the current mirror 52 is electrically connected to the first PNP BJT 63, and both the PMOS transistor 157 and the NMOS transistor 159 are electrically connected to a gate of the PMOS transistor 54.

A fixed voltage 53 is applied to both the current mirror 52 and the PMOS transistor 54. If width/length ratios (W/L ratios) of the PMOS transistors 57, 157, 54 are the same, a sensing current 66 which passes through the first magneto-resistor 56 is the same as currents passing through the PMOS transistors 57, 157. The W/L ratios of the PMOS transistors 57, 157, 54 determine the currents flowing through the PMOS transistors 57, 157, 54. If the W/L ratios of the PMOS transistors 57, 157, 54 have a ratio of 1:m:n, then a ratio of the currents flowing through the PMOS transistors 57, 157, 54 is 1:m:n. Therefore, the currents passing through the PMOS transistors 57, 157, 54 can be adjusting by adjusting their W/L ratios.

Suppose an area of the first BJT 63 and an area of the second BJT 65 have a ratio of k, then a product of the current 68 and the resistance of the second magneto-resistor 64 is:

$$IR = n * V_T * \ln k,$$

where I, R, n and $V_T$ respectively represent the current 68, the resistance of the second magneto-resistor 64, a constant approximately equal to 1 and a thermal voltage equal to 26 mV at room temperature. Since n, $V_T$ and k are all constants at room temperature, the product of the current 68 and the resistance of the second magneto-resistor 64 is a constant value. And the product can be changed by varying k. Generally, forming magneto-resistors in different wafers or chipsets with the same process may still generate magneto-resistors with different resistances. However, the first magneto-resistor 56 and the second magneto-resistor 64 are formed in the same layer of the same wafer in the same semiconductor manufacturing process so that the first magneto-resistor 56 and the second magneto-resistor 64 have the same deviation.

As mentioned in the preceding paragraphs, the product of the current 68 and the resistance of the second magneto-resistor 64 only depends on the area ratio of the first and second BJT 63, 65 at a fixed temperature, therefore the product is a constant when the area ratio is fixed. If the second magneto-resistor 64 has a resistance higher than a predetermined resistance, the current 68 will have a value lower than a predetermined current. The current 68 is mirrored onto the sensing current 66, and since the first magneto-resistor 56 has the same deviation as the second magneto-resistor 64, the product of the sensing current 66 and resistance of the first magneto-resistor 56 remains a constant even if a deviation occurs during a manufacturing process. Consequently, the information stored in the first magneto-resistor 56 can always be detected by measuring a product of the sensing current 66 and the resistance of the first magneto-resistor 56.

Figure 4:
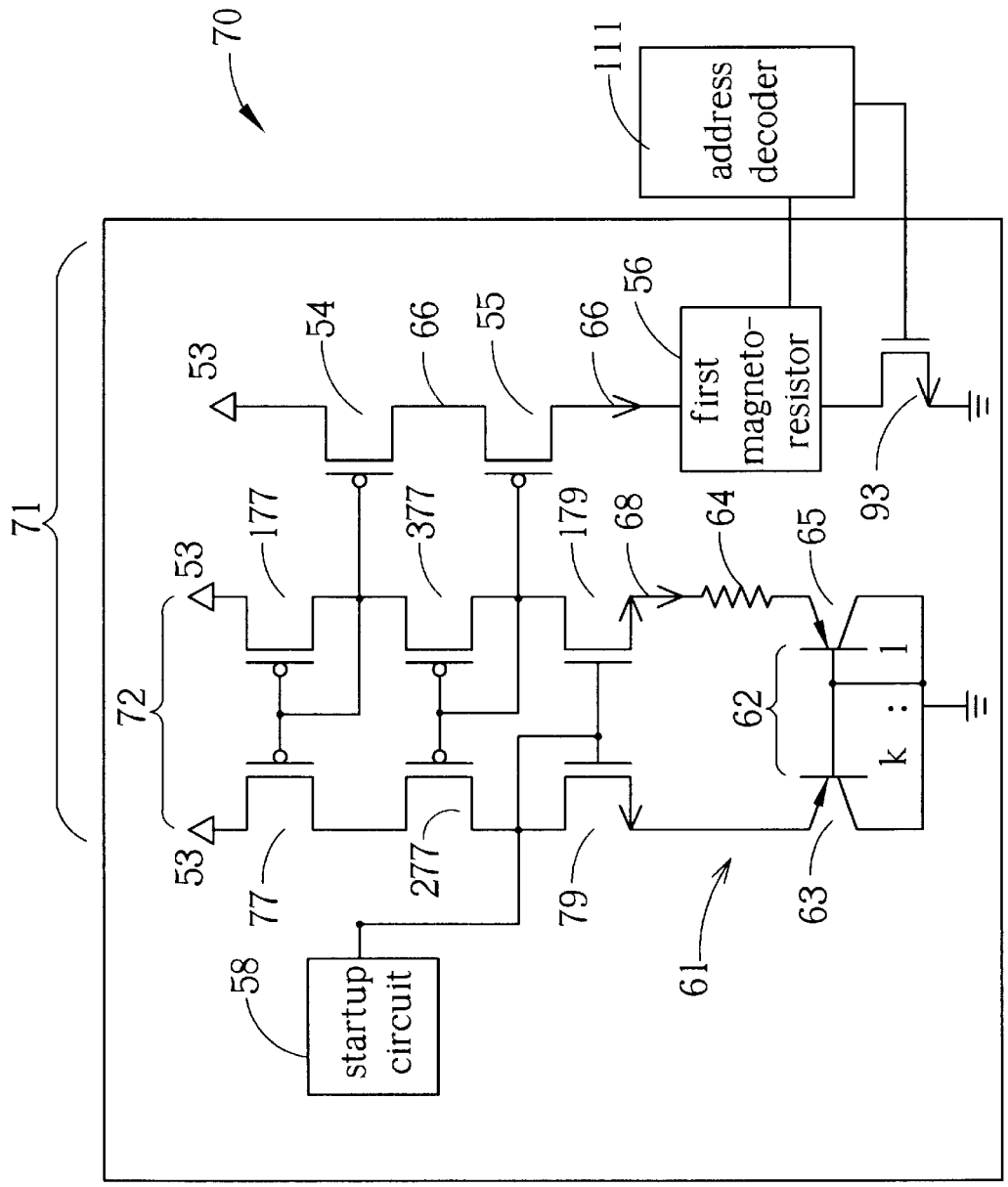
FIG. 4 is the schematic diagram of another MRAM according to the present invention.

Please refer to FIG. 4 of the schematic diagram of another MRAM 70 according to the present invention. The difference between the bias sources 51 and 71 is that the bias source 71 utilizes a different kind of current mirror 72. The current mirror 72 comprises four PMOS transistors 77, 177, 277, 377, instead of having only two PMOS transistors 57, 157, as shown in FIG. 3. However, in this configuration, the bias source 71 also needs an extra PMOS transistor 55 connected to the PMOS transistor 54 to match the behavior of the current mirror 72.

In comparison with the prior art, the product of the sensing current 66 and the resistance of the first magneto-resistor 56 is a fixed constant. Therefore, if the resistance of the first magneto-resistor 56 is deviated due to a manufacturing process, the sensing current 66 will automatically fix the deviation of the first magneto-resistor 56 so that the bit information stored in the MRAM 50, 70 can be correctly detected.

Those skilled in the art will readily observe that numerous modifications and alterations of the device may be made while retaining the teachings of the invention. Accordingly, the above disclosure should be construed as limited only by the metes and bound of the appended claims.

What is claimed is:

1. A magneto-resistive random access memory (MRAM) comprising:
    a bias source comprising:
        a current mirror for mirroring current;
        a bandgap circuit connected to the current mirror for providing a fixed voltage across a second magneto-resistor;
    a first magneto-resistor having an array of magneto-resistors electrically connected to the bias source for storing bit information; and
    an address decoder electrically connected to the first magneto-resistor for selecting the array of magneto-resistors so as to access the bit information;
    wherein the current mirror mirrors current onto the first magneto-resistor to generate a sensing current through the first magneto-resistor so that the voltage across the second magneto-resistor is proportional to a voltage across the first magneto-resistor.

2. The MRAM of claim 1 wherein the first magneto-resistor and the second magneto-resistor are formed in the same process so that resistance of the second magneto-resistor varies with resistance of the first magneto-resistor.

3. The MRAM of claim 1 wherein the bandgap circuit of the bias source comprises a first bipolar junction transistor (BJT) and a second BJT.

4. The MRAM of claim 3 wherein a base of the first BJT and a base of the second BJT are maintained at the same voltage level.

5. The MRAM of claim 3 wherein a collector of the first BJT and a collector of the second BJT are maintained at the same voltage level.

6. The MRAM of claim 3 wherein the first BJT and second BJT have a fixed area ratio relationship.

7. The MRAM of claim 3 wherein the current mirror maintains the current through the first BJT and the current through the second BJT at a predetermined current ratio.

8. The MRAM of claim 7 wherein the current mirror comprises a plurality of CMOS FETs.

9. The MRAM of claim 8 wherein the predetermined current ratio is determined by width/length ratios (W/L ratios) of the CMOS FETs.

10. The MRAM of claim 1 wherein the bit information is determined by a product of the sensing current and resistance of the first magneto-resistor.

11. The MRAM of claim 1 further comprising a transistor switch connected between the first magneto-resistor and the address decoder for allowing the address decoder to access the first magneto-resistor.

* * * * *